United States Patent
Hsiao (10) Patent No.: US 12,063,453 B2
(45) Date of Patent: Aug. 13, 2024

(54) BLIND SCAN METHOD, NON-TRANSITORY COMPUTER-READABLE MEDIUM AND CONTROL CIRCUIT THEREOF

(71) Applicant: Realtek Semiconductor Corporation, Hsinchu (TW)

(72) Inventor: Chung-Hsuan Hsiao, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 281 days.

(21) Appl. No.: 17/407,364

(22) Filed: Aug. 20, 2021

(65) Prior Publication Data
US 2022/0078367 A1    Mar. 10, 2022

(30) Foreign Application Priority Data
Sep. 4, 2020   (CN) .......................... 202010919402.7

(51) Int. Cl.
H04N 21/40    (2011.01)
H04N 5/50     (2006.01)
H04N 21/426   (2011.01)
H04N 21/438   (2011.01)

(52) U.S. Cl.
CPC ........... *H04N 5/50* (2013.01); *H04N 21/4263* (2013.01); *H04N 21/4383* (2013.01)

(58) Field of Classification Search
CPC ............................................... H04N 21/20–40
See application file for complete search history.

(56) References Cited

U.S. PATENT DOCUMENTS

| | | | | |
|---|---|---|---|---|
| 6,038,433 A | * | 3/2000 | Vegt | H03J 1/0091 455/164.2 |
| 8,270,896 B2 | * | 9/2012 | Shamain | H04H 40/90 455/3.06 |
| 2011/0135042 A1 | * | 6/2011 | Tseng | H04L 27/0014 375/344 |
| 2014/0173668 A1 | * | 6/2014 | Tseng | H04N 21/6143 725/67 |

FOREIGN PATENT DOCUMENTS

| | | |
|---|---|---|
| CN | 103905800 A | 7/2014 |
| TW | 200606659 A | 2/2006 |

OTHER PUBLICATIONS

SIPO, "CN Office Action for CN Application No. 202010919402.7", China.

* cited by examiner

*Primary Examiner* — Mushfikh I Alam
(74) *Attorney, Agent, or Firm* — Locke Lord LLP; Tim Tingkang Xia, Esq.

(57) ABSTRACT

A blind scan method includes setting a tuner to scan a first spectrum block with a first center frequency as a center and determining whether the first spectrum block comprises a possible signal; adjusting the tuner to scan a second spectrum block with a second center frequency as the center according to a first rise point and a first drop point when it is determined that the first spectrum block comprises the possible signal; and determining whether the second spectrum block comprises a valid signal.

17 Claims, 5 Drawing Sheets

BLIND SCAN METHOD, NON-TRANSITORY COMPUTER-READABLE MEDIUM AND CONTROL CIRCUIT THEREOF

CROSS-REFERENCE TO RELATED APPLICATION

This application claims the priority benefit of CHINA Application serial no. 202010919402.7, filed Sep. 4, 2020, the full disclosure of which is incorporated herein by reference.

FIELD OF INVENTION

The present disclosure relates to a blind scan method, a non-transitory computer-readable medium and a control circuit thereof. More particularly, the present disclosure relates to a blind scan method, a non-transitory computer-readable medium and a control circuit thereof applied to cable television transmission.

BACKGROUND

In wired communication systems, an echo canceler is often used to process the echo power in a channel. However, better echo cancelers require a larger hardware volume. Generally speaking, in a channel, echo power of the echo power (tap) position is small or extremely small and can be selectively ignored. Therefore, those in the field are endeavoring to find ways to reduce the volume of hardware while maintaining the echo processing effect.

SUMMARY

An aspect of this disclosure is to provide a blind scan method including the following operations: setting a tuner to scan a first spectrum block with a first center frequency as a center and determining whether the first spectrum block comprises a possible signal; adjusting the tuner to scan a second spectrum block with a second center frequency as the center according to a first rise point and a first drop point when it is determined that the first spectrum block comprises the possible signal; and determining whether the second spectrum block comprises a valid signal.

Another aspect of this disclosure is to provide a non-transient computer readable medium, including at least one program command configured to operate a method, in which the method includes the following operations: setting a tuner to scan a first spectrum block with a first center frequency as a center and determining whether the first spectrum block comprises a possible signal; adjusting the tuner to scan a second spectrum block with a second center frequency as the center according to a first rise point and a first drop point when it is determined that the first spectrum block comprises the possible signal; and determining whether the second spectrum block comprises a valid signal.

Another aspect of this disclosure is to provide a control circuit configured to set a tuner to scan a first spectrum block with a first center frequency as a center and to determine whether the first spectrum block comprises a possible signal, to adjust the tuner to scan a second spectrum block with a second center frequency as the center according to the first rise point and the first drop point when it is determined that the first spectrum block comprises the possible signal, and to determine whether the second spectrum block comprises a valid signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of elements and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Figure 1:
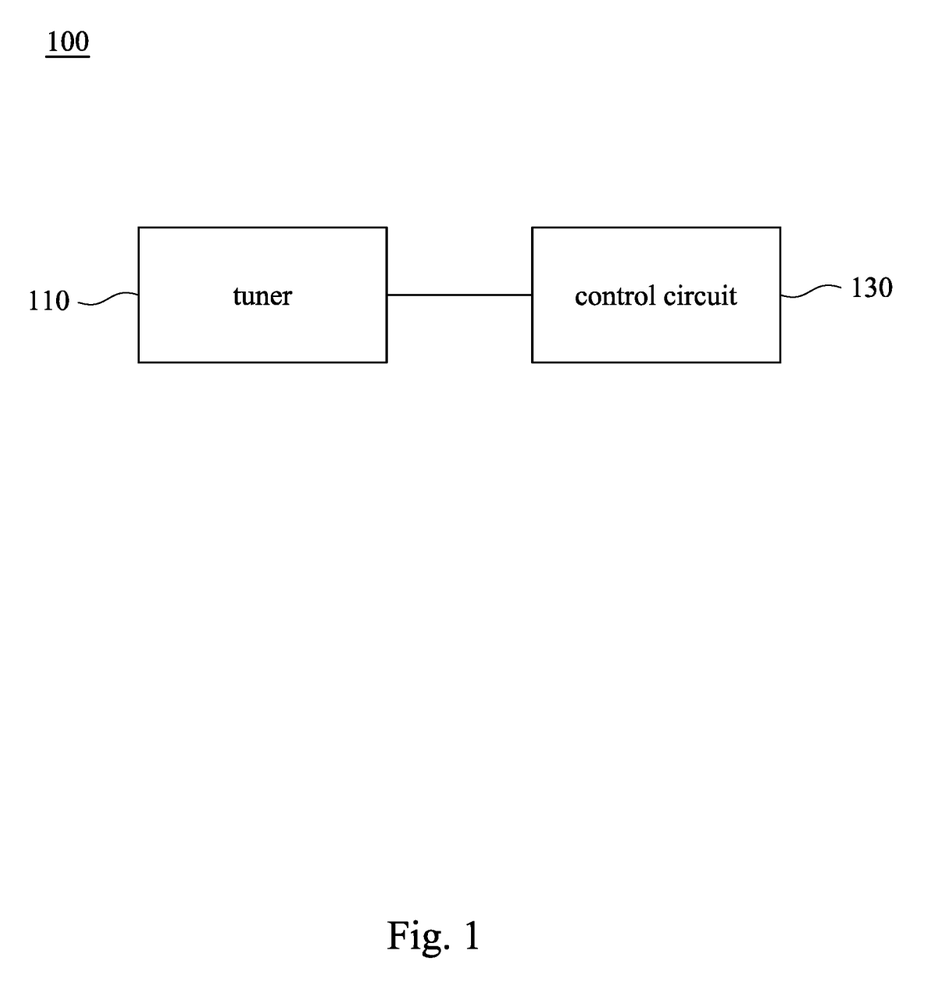
FIG. 1 is a schematic diagram illustrating a signal receiving system according to some embodiments of the present disclosure.

FIG. 1 is a schematic diagram illustrating a signal receiving system 100 according to some embodiments of the present disclosure. The signal receiving system 100 includes a tuner 110 and a control circuit 130. The tuner 110 and the control circuit 130 are coupled to each other. The signal receiving system 100 illustrated in FIG. 1 is for illustrative purposes only and the embodiments of the present disclosure are not limited thereto. Details related to the operation method of the signal receiving system 100 will be explained with reference to FIG. 2A below.

Figure 2A:
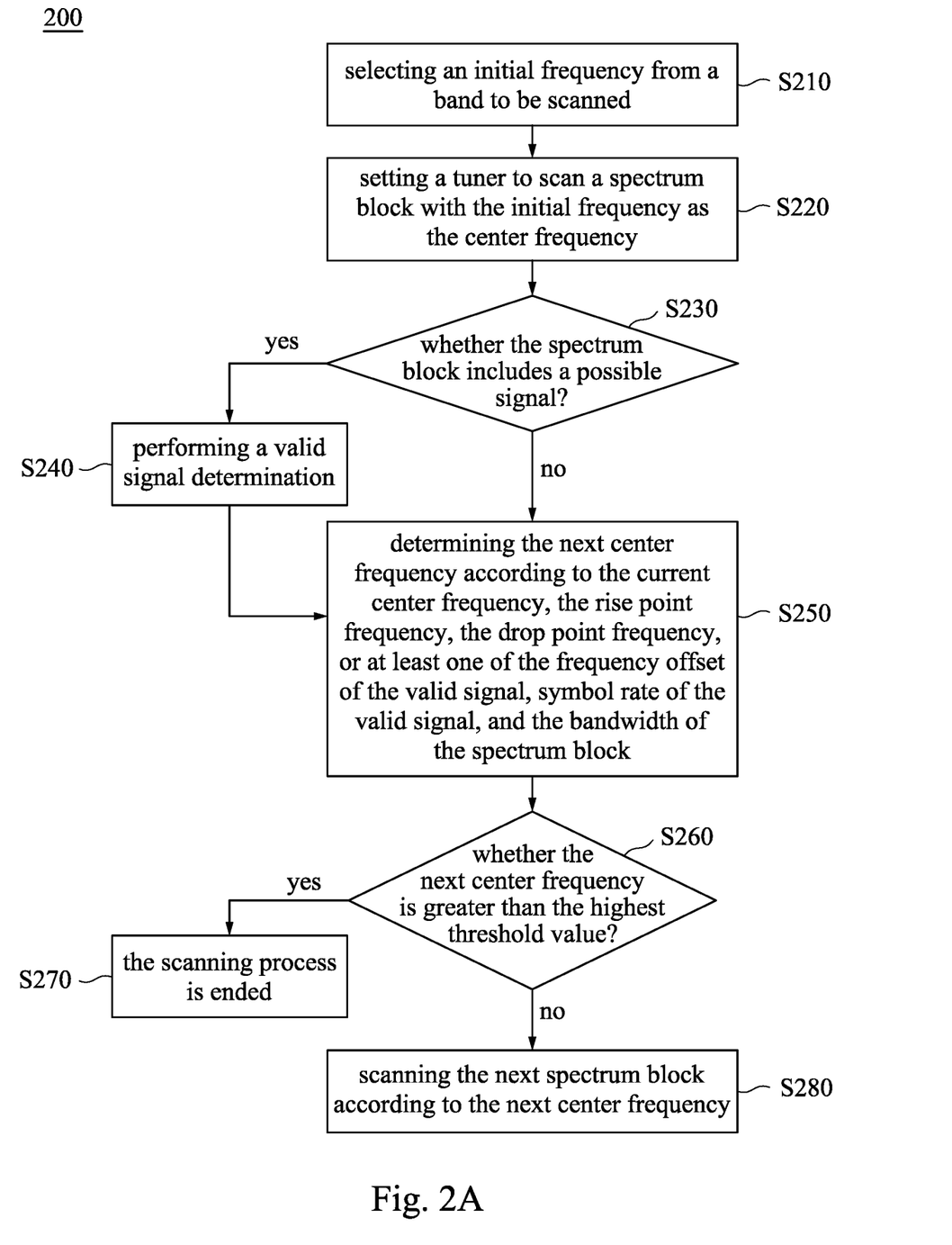
FIG. 2A is a flow chart illustrating a blind scan method according to some embodiments of the present disclosure.

Reference is made to FIG. 2A. FIG. 2A is a flow chart illustrating a blind scan method 200 according to some embodiments of the present disclosure. However, the embodiments of the present disclosure are not limited thereto.

It should be noted that the blind scan method can be applied to systems with the same or similar structure as the signal receiving system 100 in FIG. 1. For ease of explanation, FIG. 1 will be taken as an example below to describe the operation method, but the present invention is not limited to the application of FIG. 1.

It should be noted that, in some embodiments, the blind scan method 200 can also be implemented as a computer program and stored in a non-transient computer readable medium, so that a computer, an electronic device, or the aforementioned control circuit 130 shown in FIG. 1 reads the recording medium and executes the operation method. The control circuit 130 may be composed of one or more chips. The computer program can be stored in a non-transitory computer readable medium such as a ROM (read-only memory), a flash memory, a floppy disk, a hard disk, an optical disc, a flash disk, a flash drive, a tape, a database accessible from a network, or any storage medium with the same functionality that can be contemplated by persons of ordinary skill in the art to which this invention pertains.

Furthermore, is should be noted that the sequence of operations of the operation method mentioned in the present embodiment can be adjusted according to actual needs, except for when a sequence is specifically stated, and the operations can even be executed simultaneously or partially simultaneously.

Furthermore, in different embodiments, these operations may also be added, replaced, and/or omitted as needed.

Reference is made to FIG. 2A. The blind scan method 200 includes the operations as outlined below.

In operation S210, an initial frequency is selected from a band to be scanned. In some embodiments of the present disclosure, operation S210 can be executed by the control circuit 130 as shown in FIG. 1. For example, the control circuit 130 may select a frequency of 50 Mhz as the initial frequency, but the implementation of the present disclosure is not limited thereto.

Figure 3:
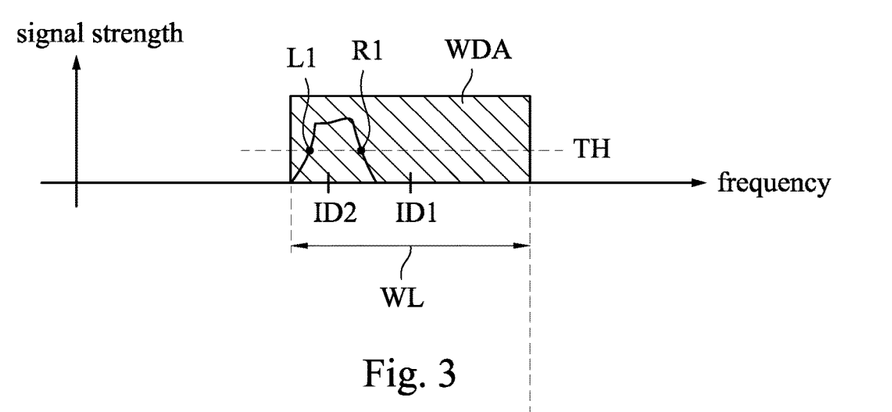
FIG. 3 is a spectrum diagram illustrating a blind scan method according to some embodiments of the present disclosure.

In operation S220, a tuner is set to scan a spectrum block with the initial frequency as the center frequency. In some embodiments, operation S220 can be executed by the control circuit 130 as shown in FIG. 1. For example, the control circuit 130 controls the tuner 110 to scan the range of a spectrum block with 50 Mhz as the center frequency. Another example is given with reference made additionally to FIG. 3. FIG. 3 is a spectrum diagram illustrating a blind scan method according to some embodiments of the present disclosure. As illustrated in FIG. 3, if the control circuit 130 sets the tuner 110 with the center frequency ID1 as the center frequency, the tuner 110 scans the spectrum block WDA with the frequency ID1 as the center.

In operation S230, a determination is made as to whether the spectrum block includes a possible signal. In some embodiments, operation S230 can be executed by the tuner 110 controlled by the control circuit 130 as shown in FIG. 1. In some embodiments, when it is determined that a rise point and/or a drop point is included in the scanning range, the control circuit 130 determines that a possible signal is included in the scanning range, and operation S240 is executed. On the other hand, when it is determined that a rise point and/or a drop point is not included in the scanning range, the control circuit 130 determines that a possible signal is not included in the scanning range, and operation S250 is executed.

For example, referring to FIG. 3, a threshold value TH is set in the control circuit 130. When operation S230 is executed, the control circuit 130 controls the tuner 110 to search for spectrum points that intersect the threshold value TH in the spectrum block WDA, and when a rise point L1 and/or a drop point R1 are obtained, it is determined that a possible signal is included.

In greater detail, when the control circuit 130 controls the tuner 110 to obtain the spectrum points that intersect with the threshold value TH, the control circuit 130 obtains a left value of the spectrum point and a right value of the spectrum point. When the left value is smaller than the right value, it is determined that the spectrum point obtained is a rise point. On the other hand, when the left value is larger than the right value, it is determined that the spectrum point obtained is a drop point. For example, as illustrated in FIG. 3, when the left value of the spectrum point L1, that is, the signal intensity value of the frequency to the left side of the spectrum point L1, is smaller than the right value of the spectrum point L1, that is, the signal intensity value of the frequency of the right side of the spectrum point L1, it is determined that the spectrum point L1 is a rise point. On the other hand, when the left value of the spectrum point R1, that is, the signal intensity value of the left side of the spectrum point R1, is larger than the right value of the spectrum point R1, that is, when the signal intensity value of the frequency of the right side of the spectrum point R1, it is determined that the spectrum point R1 is a drop point.

In operation S240, a valid signal determination is performed. In some embodiments, operation S240 is executed by the control circuit 130 as illustrated in FIG. 1. The flow of operation S240 will be described below with reference to FIG. 2B.

Figure 2B:
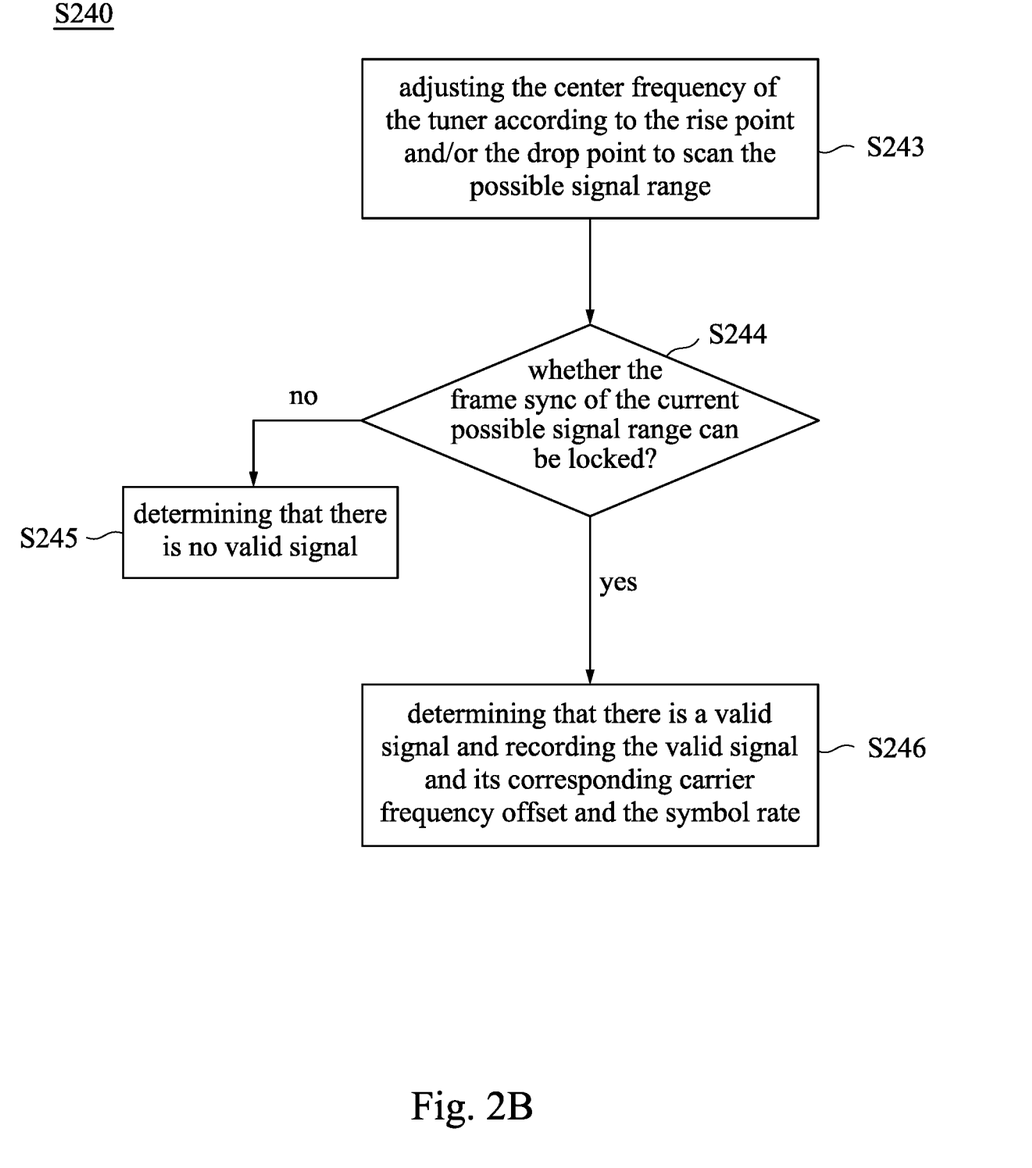
FIG. 2B is a flow chart illustrating a blind scan method according to some embodiments of the present disclosure.

Reference is made to FIG. 2B. Operation S240 includes operations as outlined below.

In operation S243, the center frequency of the tuner is adjusted according to the rise point and/or the drop point to scan the possible signal range. In some embodiments, the control circuit 130 adjusts the center frequency of the tuner 110 according to the rise point and/or the drop point. In some embodiments, the control circuit 130 calculates the position of the rise point and the average value position of the position of the drop point, and the center frequency of the tuner 110 is set to be moved to the average value position of the position of the rise point and the position of the drop point.

Figure 4:
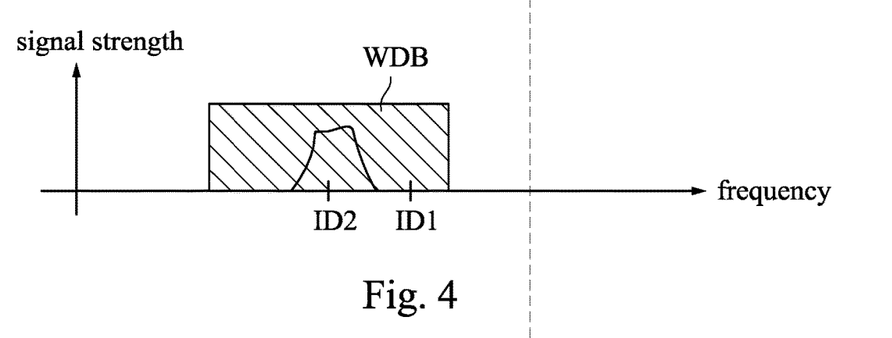
FIG. 4 is a spectrum diagram illustrating a blind scan method according to some embodiments of the present disclosure.

An example is given with reference to FIG. 3. The average value of the rise point L1 and the drop point R1 on the spectrum is frequency ID2. After the control circuit 130 calculates the average value position, the center frequency of the tuner 110 is moved to the frequency ID2, as illustrated in FIG. 4. Referring to FIG. 4, after the center frequency of the tuner 110 moves to take the frequency ID2 as the center, the possible signal range is the spectrum block WDB, and the tuner 110 scans the spectrum block WDB.

Figure 6:
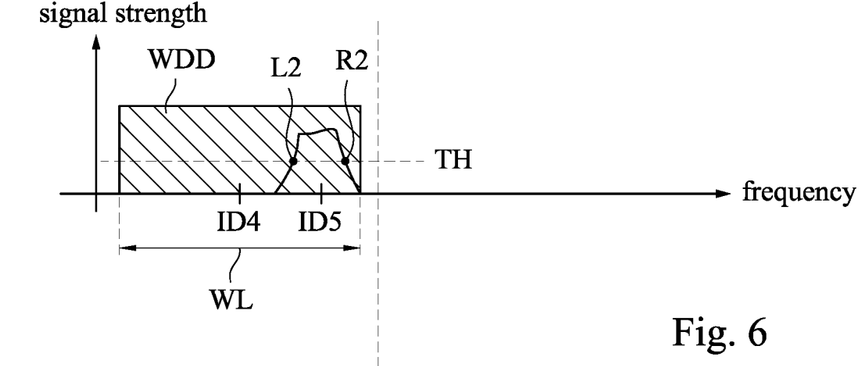
FIG. 6 is a spectrum diagram illustrating a blind scan method according to some embodiments of the present disclosure.
Figure 7:
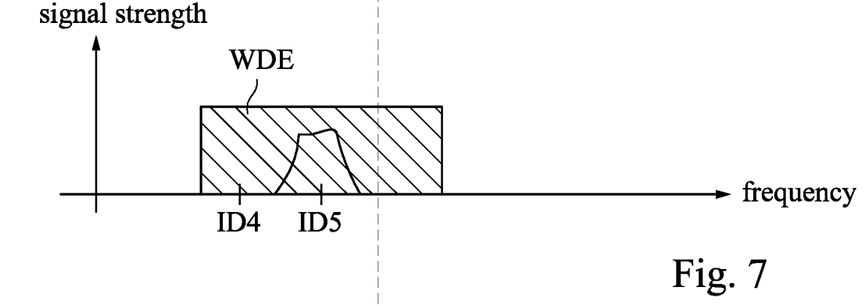
FIG. 7 is a spectrum diagram illustrating a blind scan method according to some embodiments of the present disclosure.

Another example is given with reference to FIG. 6. The average value position of the position of the rise point L2 and the position of the drop point R2 is frequency ID5. After the control circuit 130 calculates the average value position, the center frequency of the tuner 110 is moved to the frequency ID5, as illustrated in FIG. 7. Referring to FIG. 7, after the center frequency of the tuner 110 is moved to take the frequency ID5 as the center, the possible signal range is the spectrum block WDE, and the tuner 110 scans the spectrum block WDE.

Figure 9:
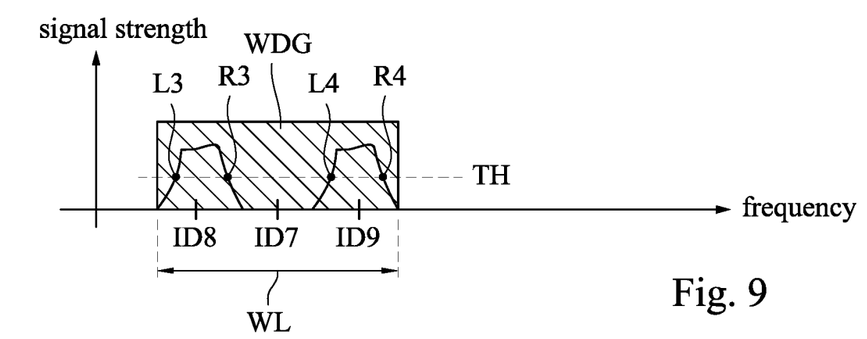
FIG. 9 is a spectrum diagram illustrating a blind scan method according to some embodiments of the present disclosure.

In some embodiments, the spectrum point intersecting the threshold value TH includes not only one set of rise point and/or drop point. As an example, referring to FIG. 9, the spectrum points intersecting the threshold value TH include a set consisting of the rise point L3 and the drop point R3 and a set consisting of the rise point L4 and the drop point R4, that is, two sets of rise points and drop points. In this case, the center frequency will first move to the average value position ID8 of the first set of the rise point L3 and the drop point R3 to scan the possible signal range, and then, the center frequency moves to the average value position ID9 of the second set of the rise point L4 and the drop point R4 to scan the possible signal range.

In operation S244, a determination is made as to whether the frame sync of the current possible signal range can be locked. If it is determined that the frame sync of the current possible signal range can be locked, operation S246 is performed. On the other hand, if it is determined that the frame sync of the current possible signal range is unable to be locked, operation S245 is performed. An example is given with reference to FIG. 4. The control circuit 130 in FIG. 4 determines whether the frame sync of the spectrum block WDB can be locked.

In some embodiments, when it is determined that the frame sync of the current possible signal range cannot be locked, that is, when the valid signal is not included, and the adjusted center frequency is located to the left side of the center frequency before adjustment, the control circuit 130 lowers the center frequency of the tuner 110 by a fixed frequency, that is, a left shift in the spectrum diagram, to obtain the scan result of the spectrum block (not shown) centered on the down-tuned frequency, and to determine whether the spectrum block centered on the down-tuned frequency contains a valid signal.

An example is given with reference to FIG. 3 and FIG. 4. If it is determined that the spectrum block WDB does not include a valid signal, and the spectrum block WDB is located at the left side of the spectrum block WDA, the control circuit 130 lowers the tuner 110 by a fixed frequency. In some embodiments, the fixed frequency used by the tuner 110 is 0.9 MHz, and the frequency ID2 is 47 MHz. At this time, the center frequency of the tuner 110 is moved from 47 MHz to 46.1 MHz. Next, the control circuit 130 determines whether a valid signal is included in the spectrum block centered at the frequency 46.1 MHz.

However, it should be noted that, in the above operation, the center frequency of the tuner 110 can be lowered in a limited range. In greater detail, after the center frequency of the tuner 110 is lowered by a fixed frequency, if the center frequency of the tuner 110 exceeds the range of the spectrum block WDA, the center frequency of the tuner 110 will no longer be lowered. For example, as illustrated in FIG. 3, assuming that the range of the spectrum block WDA is from a frequency of 46 MHz to a frequency of 54 MHz, in the above operation, the center frequency of the tuner 110 cannot be lowered below 46 MHz.

Similarly, in some embodiments, when it is determined that the frame sync of the current possible signal range cannot be locked and the adjusted center frequency is located to the right side of the center frequency before adjustment, the control circuit 130 increases the center frequency of the tuner 110 by a fixed frequency. That is, the right shift in the spectrum diagram to obtain the scan result of the spectrum block (not shown) centered on the frequency is increased, and it is determined whether the spectrum block centered on the frequency increased includes a valid signal.

An example is given with reference to FIG. 6 and FIG. 7. If it is determined that the spectrum block WDE does not include a valid signal, and the spectrum block WDE is located to the right side of the spectrum block WDD, the tuner 110 is increased by a fixed frequency. In some embodiments, the fixed frequency increased by the tuner 110 is 0.9 MHz. If the frequency position ID5 is 52.5 MHz, the center frequency of the tuner 110 will be moved from the frequency 52.5 MHz to the frequency 53.4 MHz.

Similarly, it should be noted that, in some embodiments, in this operation, the range of the center frequency of the tuner 110 is limited. In greater detail, after the center frequency of the tuner 110 is increased by a fixed frequency, if its center frequency exceeds the range of the spectrum block WDD, the center frequency of the tuner 110 will not be increased at this time. For example, as shown in FIG. 6, assuming that the range of the first spectrum block WDD is from a frequency a 46 MHz to a frequency of 54 MHz, in operation S270, the center frequency of the tuner 110 cannot be adjusted higher than 54 MHz.

In operation S245, it is determined that there is no valid signal.

In operation S246, it is determined that there is a valid signal, and the valid signal and its corresponding carrier frequency offset (CFO) and the symbol rate are recorded. An example is given with reference to FIG. 4. If it is determined that the current signal range (that is, the spectrum block WDB) is a valid signal, the control circuit 130 determines that there is a valid signal and records the valid signal and its corresponding frequency offset (CFO) and symbol rate (SR).

Reference is made to FIG. 2A again. In operation S250, the next center frequency is determined according to the current center frequency, the rise point frequency, the drop point frequency, or at least one of the frequency offset of the valid signal, symbol rate of the valid signal, and the bandwidth of the spectrum block.

In greater detail, in some embodiments, if in the previous operation, that is, operation S240 or operation S230, it is determined that there is no valid signal or no possible signal, the current center frequency plus the bandwidth of the scanned spectrum block is the next center frequency.

On the other hand, if in the previous operation, that is, operation S240 or operation S230, it is determined that there is a valid signal and the adjusted center frequency in operation S243 is located at the left side of the center frequency before adjustment, that is, the adjusted center frequency is lower than the center frequency before adjustment, the next center frequency is the center frequency before adjustment plus the bandwidth of the scanned spectrum block. If in the previous operation it is determined that there is a valid signal and the adjusted center frequency in operation S243 is located at the right side of the center frequency before adjustment, that is, the adjusted center frequency is higher than the center frequency before adjustment, the next center frequency is the adjusted center frequency plus the frequency offset of the recorded valid signal plus half of the symbol rate of the valid signal plus half of the bandwidth of the spectrum block.

Figure 5:
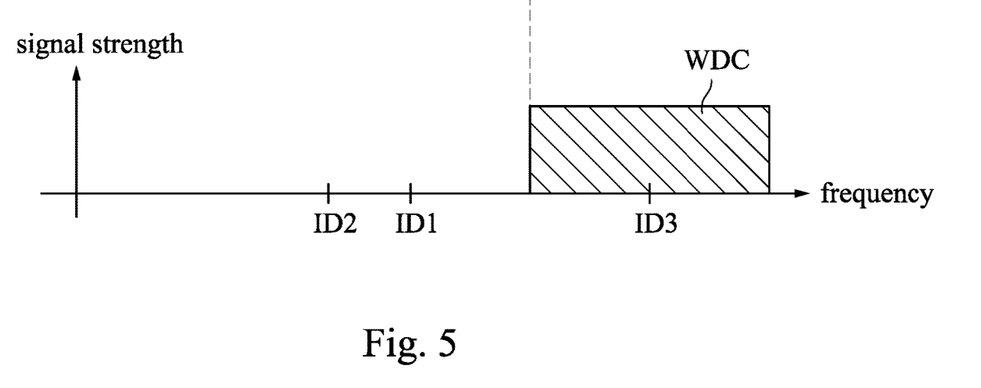
FIG. 5 is a spectrum diagram illustrating a blind scan method according to some embodiments of the present disclosure.

An example is given with reference to FIG. 3 to FIG. 5. The center frequency ID1 in FIG. 3 is the center frequency before adjustment, and the center frequency ID2 in FIG. 4 is the center frequency after adjustment. Since the center frequency ID1 before adjustment is located at the right side of the adjusted center frequency ID2, the next center frequency is the center frequency ID1 before adjustment plus the bandwidth WL of the scanned spectrum block WDA. After calculation, the next scan center is the frequency center ID3 shown in FIG. 5.

Figure 8:
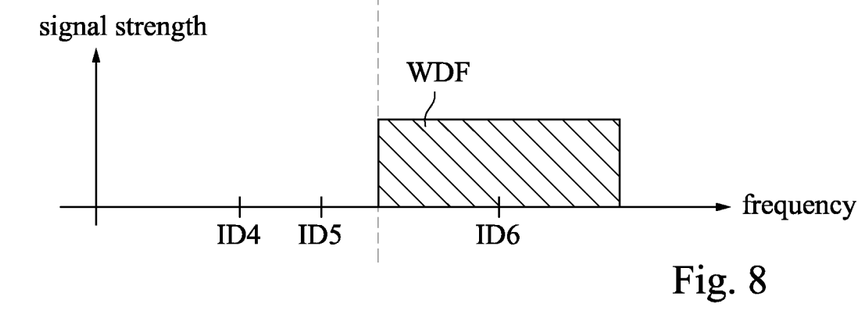
FIG. 8 is a spectrum diagram illustrating a blind scan method according to some embodiments of the present disclosure.

Another example is given with reference to FIG. 6 to FIG. 8. The center frequency ID4 in FIG. 6 is the center frequency before adjustment, and the center frequency ID5 in FIG. 7 is the center frequency after adjustment. Since the adjusted center frequency ID5 is located at the right side of the center frequency ID4 before adjustment, the next center frequency is the adjusted center frequency ID5 plus the frequency offset of the recorded valid signal plus half of the symbol rate of the valid signal plus half of the bandwidth WL of the spectrum block WDD. After calculation, the next scan center is the frequency center ID6 as shown in FIG. 8.

In some embodiments, when the determination result in operation S240 includes more than two valid signals, the valid signal with the highest center frequency, that is, the valid signal located on the far right side of the spectrum, is used as the adjusted center frequency. For example, in the case of FIG. 9, the average value position ID9 of the second set of rise point L4 and drop point R4 will be used as the adjusted center frequency, and the adjusted center frequency ID9 plus the frequency offset of the recorded valid signal plus half of the symbol rate of the valid signal plus half of the bandwidth WL of the spectrum block WDD determines the next center frequency.

In operation S260, a determination is made as to whether the next center frequency is greater than the highest threshold value. In some embodiments, operation S260 may be executed by the control circuit 130 as illustrated in FIG. 1. In some embodiments, the highest threshold value is 858 MHz. However, the embodiments of the present disclosure are not limited thereto.

In operation S270, the scanning process is ended. That is, the current scanning process is ended.

In operation S280, the next spectrum block is scanned according to the next center frequency. In some embodiments, operation S280 can be executed by the control circuit 130 as illustrated in FIG. 1. An example is given with reference to FIG. 5. After the center frequency moves to the center frequency ID3, the control circuit 130 controls the tuner 110 to scan the spectrum block WDC according to the center frequency ID3. Another example is given with reference to FIG. 8. After the center frequency moves to the center frequency ID6, the control circuit 130 controls the tuner 110 to scan the spectrum block WDF according to the center frequency ID6.

The blind scan method 200 of the present disclosure scans from the left end of the spectrum to the right end of the spectrum, so as to complete the scan of all the spectrums and find the valid signal. In one embodiment, after all the valid signals are found, the frequency corresponding to the valid signal can be stored in the memory (not shown in the figure). For example, the frequency can be a channel of a TV station. In this way, the user can adjust the TV station for previewing accordingly.

The above-mentioned values of frequency modulation bandwidth, movement distance, and frequency position are for illustrative purposes only, and the embodiments of the present disclosure are not limited thereto.

In some embodiments, the control circuit 130 may be a server, a circuit, or a central processing unit (CPU), microprocessor (MCU) or another device with functions such as storage, calculation, data reading, receiving signals or messages, and transmitting signals or messages or other equivalent functions.

According to embodiments of the present disclosure, it is understood that the embodiments of the present disclosure provide a blind scan method, a non-transitory computer-readable medium and a control circuit thereof. With the method of searching the signal rise point and drop point on the spectrum, the frequency of the signal in the tuner range can be determined quickly, and during the next adjustment, the center frequency of the tuner is adjusted to the spectrum that is not covered by the blind scan spectrum block, in which the frequency of the valid signal can be scanned out faster.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased in number, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A blind scan method, comprising:
    setting a tuner to scan a first spectrum block with a first center frequency as a center and determining whether the first spectrum block comprises a possible signal;
    setting a threshold value and searching at least one spectrum point intersecting with the threshold value in the first spectrum block to obtain a first rise point or a first drop point, comprising:
        obtaining a first signal intensity value of a left side frequency of the at least one spectrum point and a second signal intensity value of a right side frequency of the at least one spectrum point;
        determining that the at least one spectrum point is the first rise point when the first signal intensity value is smaller than the second signal intensity value; and
        determining that the at least one spectrum point is the first drop point when the first signal intensity value is larger than the second signal intensity value;
    adjusting the tuner to scan a second spectrum block with a second center frequency as the center according to the first rise point and the first drop point when it is determined that the first spectrum block comprises the possible signal; and
    determining whether the second spectrum block comprises a valid signal.

2. The blind scan method of claim 1, further comprising:
    calculating a first average value of the first rise point and the first drop point; and
    setting the first average value to be the second center frequency.

3. The blind scan method of claim 1, further comprising:
    setting the tuner to scan a third spectrum block with a third center frequency as the center, wherein the third spectrum block does not overlap with the first spectrum block.

4. The blind scan method of claim 3, wherein when it is determined that the second spectrum block does not comprise the valid signal or does not comprise the possible signal, the third center frequency is the second center frequency adding a bandwidth of the first spectrum block.

5. The blind scan method of claim 3, wherein when it is determined that the second spectrum block comprises the valid signal and the second center frequency is higher than the first center frequency, the third center frequency is the second center frequency adding a frequency offset value, half of a symbol rate and half of a bandwidth of the first spectrum block.

6. The blind scan method of claim 3, wherein when it is determined that the second spectrum block comprises the valid signal and the second center frequency is lower than the first center frequency, the third center frequency is the first center frequency adding a bandwidth of the first spectrum block.

7. The blind scan method of claim 1, further comprising:
calculating a fourth center frequency according to a second rise point and a second drop point when the first spectrum block further comprises the second rise point and the second drop point; and
setting the tuner to perform scanning with the second center frequency as the center and then setting the tuner to perform scanning with the fourth center frequency as the center when the fourth center frequency is higher than the second center frequency.

8. The blind scan method of claim 1, further comprising:
setting the tuner to perform scanning with a third center frequency as the center when it is determined that the second spectrum block does not comprise the valid signal and the second spectrum block is located at a left side of the first spectrum block, wherein the third center frequency is obtained by the second center frequency being lowered by a fixed frequency; and
setting the tuner to perform scanning with a fourth center frequency as the center when it is determined that the second spectrum block does not comprise the valid signal and the second spectrum block is located at a right side of the first spectrum block, wherein the fourth center frequency is obtained by the second center frequency being increased by the fixed frequency.

9. The blind scan method of claim 8, wherein when the third center frequency or the fourth center frequency obtained after the second center frequency is lowered or increased exceeds a range of the first spectrum block, the second center frequency is not increased or lowered.

10. A nontransitory computer readable medium, wherein the nontransitory computer readable medium has one or more computer programs stored therein, and the one or more computer programs can be executed by one or more processors so as to be configured to operate a method, wherein the method comprises:
setting a tuner to scan a first spectrum block with a first center frequency as a center and determining whether the first spectrum block comprises a possible signal;
setting a threshold value and searching at least one spectrum point intersecting with the threshold value in the first spectrum block to obtain a first rise point or a first drop point, comprising:
obtaining a first signal intensity value of a left side frequency of the at least one spectrum point and a second signal intensity value of a right side frequency of the at least one spectrum point;
determining that the at least one spectrum point is the first rise point when the first signal intensity value is smaller than the second signal intensity value; and
determining that the at least one spectrum point is the first drop point when the first signal intensity value is larger than the second signal intensity value;
adjusting the tuner to scan a second spectrum block with a second center frequency as the center according to the first rise point and the first drop point when it is determined that the first spectrum block comprises the possible signal; and
determining whether the second spectrum block comprises a valid signal.

11. The nontransitory computer readable medium of claim 10, the method further comprising:
calculating a first average value of the first rise point and the first drop point; and
setting the first average value to be the second center frequency.

12. The nontransitory computer readable medium of claim 10, the method further comprising:
setting the tuner to scan a third spectrum block with a third center frequency as the center, wherein the third spectrum block does not overlap with the first spectrum block.

13. The nontransitory computer readable medium of claim 12, wherein setting the tuner to scan the third spectrum block with the third center frequency as the center comprises:
when it is determined that the second spectrum block does not comprise the valid signal or does not comprise the possible signal, the third center frequency is the second center frequency adding a bandwidth of the first spectrum block;
when it is determined that the second spectrum block comprises the valid signal and when the second center frequency is lower than the first center frequency, the third center frequency is the first center frequency adding the bandwidth of the first spectrum block; and
when it is determined that the second spectrum block comprises the valid signal and when the second center frequency is higher than the first center frequency, the third center frequency is the second center frequency adding a frequency offset value, half of a symbol rate and half of the bandwidth of the first spectrum block.

14. The nontransitory computer readable medium of claim 10, the method further comprising:
setting the tuner to perform scanning with a third center frequency as the center when it is determined that the second spectrum block does not comprise the valid signal and the second spectrum block is located at a left side of the first spectrum block, wherein the third center frequency is obtained by the second center frequency being lowered by a fixed frequency; and
setting the tuner to perform scanning with a fourth center frequency as the center when it is determined that the second spectrum block does not comprise the valid signal and the second spectrum block is located at a right side of the first spectrum block, wherein the fourth center frequency is obtained by the second center frequency being increased by the fixed frequency; and
wherein if the third center frequency or the fourth center frequency obtained after the second center frequency is lowered or increased exceeds a range of the first spectrum block, the second center frequency is not increased or lowered.

15. A control circuit, configured to set a tuner to scan a first spectrum block with a first center frequency as a center and to determine whether the first spectrum block comprises a possible signal, to set a threshold value and searching at least one spectrum point intersecting with the threshold value in the first spectrum block to obtain a first rise point or a first drop point, to adjust the tuner to scan a second spectrum block with a second center frequency as the center according to the first rise point and the first drop point when it is determined that the first spectrum block comprises the possible signal, and to determine whether the second spectrum block comprises a valid signal, wherein the control circuit is further configured to:
- obtain a first signal intensity value of a left side frequency of the at least one spectrum point and a second signal intensity value of a right side frequency of the at least one spectrum point;
- determine that the at least one spectrum point is the first rise point when the first signal intensity value is smaller than the second signal intensity value; and
- determine that the at least one spectrum point is the first drop point when the first signal intensity value is larger than the second signal intensity value.

16. The control circuit of claim 15, wherein the control circuit is configured to set a first average value of the first rise point and the first drop point to be the second center frequency.

17. The control circuit of claim 15, wherein the control circuit is further configured to set the tuner to scan a third spectrum block with a third center frequency as the center, wherein the third spectrum block does not overlap with the first spectrum block.

* * * * *